United States Patent
Cao et al.

(10) Patent No.: US 9,514,832 B2
(45) Date of Patent: Dec. 6, 2016

(54) ACCESS APPARATUS OF MEMORY CARD AND CONTROL METHOD THEREOF

(71) Applicant: Wistron Corporation, New Taipei (TW)

(72) Inventors: Qi Cao, New Taipei (TW); Peng-Fei Li, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/805,409

(22) Filed: Jul. 21, 2015

(65) Prior Publication Data

US 2016/0260494 A1 Sep. 8, 2016

(30) Foreign Application Priority Data

Mar. 2, 2015 (CN) .......................... 2015 1 0092890

(51) Int. Cl.
| | |
|---|---|
| *G11C 16/30* | (2006.01) |
| *G11C 16/22* | (2006.01) |
| *G11C 16/10* | (2006.01) |
| *G11C 16/26* | (2006.01) |
| *H05K 5/00* | (2006.01) |

(52) U.S. Cl.
CPC ............... *G11C 16/30* (2013.01); *G11C 16/10* (2013.01); *G11C 16/22* (2013.01); *G11C 16/26* (2013.01); *H05K 5/0069* (2013.01)

(58) Field of Classification Search
CPC ......... G11C 16/30; G11C 16/10; G11C 16/22; G11C 16/26; H05K 5/0069
USPC ....................................................... 365/226
See application file for complete search history.

(56) References Cited

U.S. PATENT DOCUMENTS

2008/0156884 A1* 7/2008 Choi .................... G06K 19/077
 235/492
2010/0131707 A1* 5/2010 Chi ....................... G06F 13/385
 711/115

* cited by examiner

*Primary Examiner* — Alexander Sofocleous
*Assistant Examiner* — Alfredo Bermudez Lozada
(74) *Attorney, Agent, or Firm* — Jianq Chyun IP Office

(57) ABSTRACT

An access apparatus for memory card and a control method thereof are provided. The access apparatus is adapted for receiving a memory card with a side having a supply voltage pin and includes a slot module. The slot module includes a slot having a first side and a second side corresponding to each other. The first side and the second side are respectively configured with a first supply voltage pin and a second supply voltage pin, and the first supply voltage pin and the second supply voltage pin are spaced apart and opposite to each other. The access apparatus selectively determines whether to forbid performing a write operation to the memory card according to a conduction status of the first supply voltage pin and the second supply voltage pin with the supply voltage pin caused by a facing direction of the memory card inserted in the slot.

14 Claims, 5 Drawing Sheets

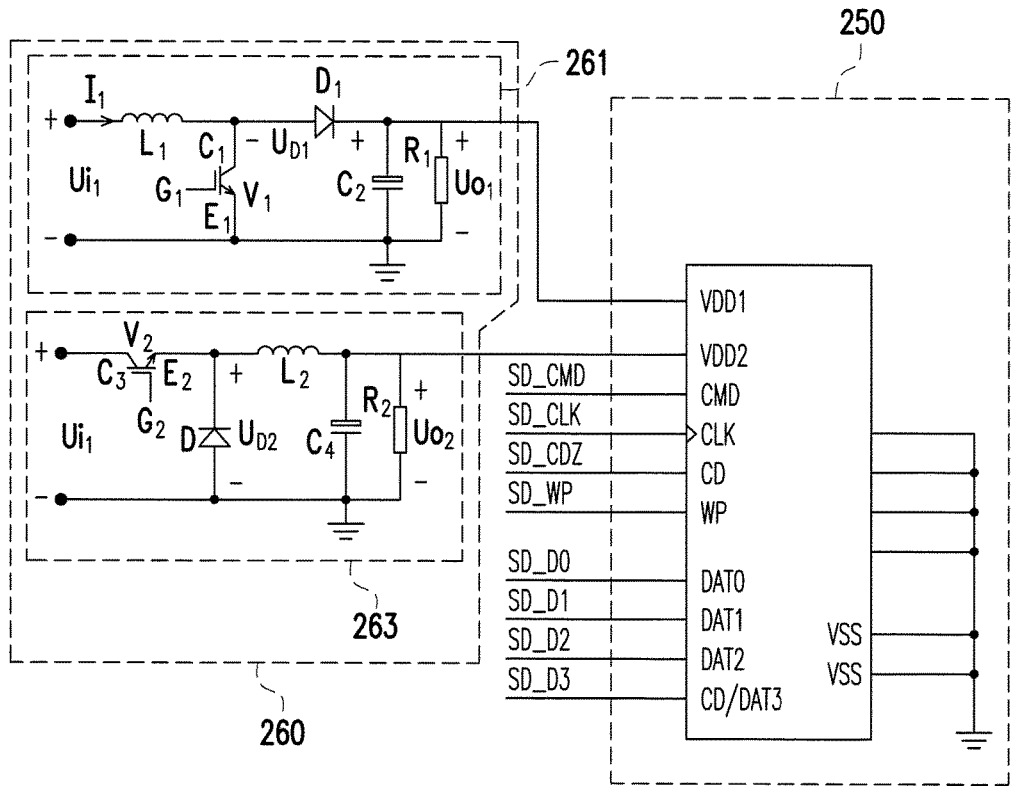

FIG. 5

| Provide a slot module, where the slot module includes a slot having a first supply voltage pin and a second supply voltage pin spaced apart and opposite to each other for receiving insertion of the memory card | S601 |

| Selectively forbid or permit a write operation performed to the memory card according to the conduction status of the first supply voltage pin and the second supply voltage pin with the supply voltage pin of the memory card caused by a facing direction of the memory card inserted in the slot | S603 |

FIG. 6

ACCESS APPARATUS OF MEMORY CARD AND CONTROL METHOD THEREOF

CROSS-REFERENCE TO RELATED APPLICATION

This application claims the priority benefit of China application serial no. 201510092890.8, filed on Mar. 2, 2015. The entirety of the above-mentioned patent application is hereby incorporated by reference herein and made a part of this specification.

BACKGROUND OF THE INVENTION

Field of the Invention

The invention relates to an access control method, and particularly relates to an access apparatus of memory card and a control method thereof.

Description of Related Art

Along with progress of technology, portable electronic devices (for example, smart phones, tablet PCs, etc.) having a variety of different functions (for example, phone call, mobile Internet accessing, multimedia data playing, etc.) can bring a lot of conveniences to people's lives, so that the portable electronic devices are widely used all over the world. The portable electronic device in the market generally has a data storage device (for example, a memory card, a hard disk, etc.) for storing data (for example, files, music, video films, etc.). Along with widespread of the portable electronic devices, the data storage devices are also widespread, and techniques thereof are continuously ameliorated and developed. The memory card (for example, a multi media card (MMC), a secure digital (SD) card, a compact flash (CF) card, etc.) is one of the most commonly used data storage devices.

On the other hand, in some specific cases (for example, to store important data, etc.); a user does not want the stored data to be duplicated or modified. In order to protect the data stored in the memory card, memory cards having a write-protection switch are developed. For example, FIG. 1A and FIG. 1B are examples of an SD card having a write-protection switch. Referring to FIG. 1A, the SD card 100 has a write-protection switch 105 with a sliding structure. When the write-protection switch 105 is pushed to a top position of a sliding zone thereof, and the SD card 100 is inserted into a slot of an access apparatus, a moving terminal 130 in the access apparatus is pushed by the write-protection switch 105 and is electrically connected to a detection terminal 135, such that a pin connected to the moving terminal 130 outputs a low level voltage, and now the SD card 100 is in a read/write state. Referring to FIG. 1B, when the write-protection switch 105 is pushed to a bottom position of the sliding zone thereof, the moving terminal 130 is not electrically connected to the detection terminal 135, such that the pin connected to the moving terminal 130 outputs a high level voltage, and now the SD card 100 is in a read-only state.

However, in the aforementioned write-protection mechanism implemented by sliding the write-protection switch, if the write-protection switch is slid too frequently, the write-protection switch is probably loosened or even falls off, which results in a fact that the SD card is only identified to be in the read-only state and causes inconvenience to the user. Moreover, during a process of manufacturing the SD card, an upper and a lower protection cases of the SD card usually cannot be completely packaged in one packaging process, such that the gap of the write-protection structure becomes a potential reason for splitting the protection cases. Therefore, it is necessary to provide a more stable and reliable method to implement the write-protection mechanism of the memory card.

SUMMARY OF THE INVENTION

The invention is directed to an access apparatus of memory card and a control method thereof, which is adapted to receive a memory card inserted with a front side or a back side facing upward, and has a slot having two supply voltage pins, so as to determine whether to execute a write protection operation to the memory card according to a conduction status of the two supply voltage pins after the memory card is inserted into the slot.

The invention provides an access apparatus of memory card, which is adapted for receiving a memory card with a side having a supply voltage pin. The access apparatus includes a slot module, and the slot module includes a slot to receive insertion of the memory card. The slot includes a first side and a second side corresponding to each other. The first side and the second side are respectively configured with a first supply voltage pin and a second supply voltage pin, and the first supply voltage pin and the second supply voltage pin are spaced apart and opposite to each other. The access apparatus selectively determines whether to forbid performing a write operation to the memory card according to a conduction status of the first supply voltage pin and the second supply voltage pin with the supply voltage pin caused by a facing direction of the memory card inserted in the slot.

In an embodiment of the invention, the access apparatus includes a voltage control circuit. The voltage control circuit provides a first supply voltage to the first supply voltage pin, and provides a second supply voltage to the second supply voltage pin, where the first supply voltage is different to the second supply voltage. The access apparatus determines whether the first supply voltage or the second supply voltage is received, so as to determine the conduction status of the first supply voltage pin and the second supply voltage pin.

In an embodiment of the invention, the voltage control circuit includes a boost circuit and a buck circuit. The boost circuit is configured to provide the first supply voltage. The buck circuit is configured to provide the second supply voltage.

In an embodiment of the invention, the first side of the slot includes a plurality of pins containing the first supply voltage pin, the second side includes a plurality of pins containing the second supply voltage pin, and an arranging sequence of the pins of the first side is opposite to an arranging sequence of the pins of the second side.

The invention provides a control method for an access apparatus of memory card; the access apparatus is adapted for receiving a memory card with a side having a supply voltage pin. The control method includes following steps. A slot module is provided, where the slot module includes a slot to receive insertion of the memory card. The slot includes a first side and a second side corresponding to each other. The first side and the second side are respectively configured with a first supply voltage pin and a second supply voltage pin, and the first supply voltage pin and the second supply voltage pin are spaced apart and opposite to each other. When the memory card is inserted into the slot module with a first facing direction, the supply voltage pin is conducted with the first supply voltage pin of the slot, such that a write operation is able to be performed to the memory card. When the memory card is inserted into the slot module with a second facing direction, the supply voltage pin is conducted with the second supply voltage pin of the slot, such that the write operation is forbidden to be performed to the memory card.

According to the above descriptions, the access apparatus of the invention provides a slot having the first supply voltage pin and the second supply voltage pin, where the first supply voltage pin and the second supply voltage pin are respectively disposed on the first side and the second side corresponding to each other in the slot, such that the first supply voltage pin and the second supply voltage pin are spaced apart and opposite to each other. The access apparatus can determine the conduction status of the first supply voltage pin and the second supply voltage pin with the supply voltage pin of the memory card caused by the facing direction of the memory card inserted in the slot, so as to selectively determine whether to forbid performing the write operation to the inserted memory card. In this way, the conventional write-protection switch structure is omitted, and a more convenient and easy write-protection mechanism is provided to the user.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a circuit schematic diagram of a slot module and a voltage control circuit.

FIG. 6 is a flowchart illustrating a control method for an access apparatus of memory card according to an embodiment of the invention.

DESCRIPTION OF EMBODIMENTS

In order to provide a stable and reliable method to implement a write-protection mechanism of a memory card (for example, a multi media card (MMC), a secure digital (SD) card, a compact flash (CF) card, etc.), embodiments of the invention provide an access apparatus having a slot with two supply voltage pins (for example, a VDD pin) spaced apart and opposite to each other, after the memory card is inserted into the slot with a front side or a back side facing upward, the memory card is selectively and electrically coupled to only one of the supply voltage pins. The access apparatus of the invention determines a conduction status of the two supply voltage pins to selectively forbid performing a write operation to the memory card or permit to perform the write operation. In this way, a user can intuitively select to insert the memory card into the slot with the back side thereof facing upward according to an actual demand to implement the write-protection mechanism, so as to save the conventional mechanism for pushing a write-protection switch. A plurality of embodiments complied with the spirit of the invention are provided below, and those skilled in the art can suitably adjust the embodiments according to an actual requirement without being limited by the content described below.

Figure 1A:
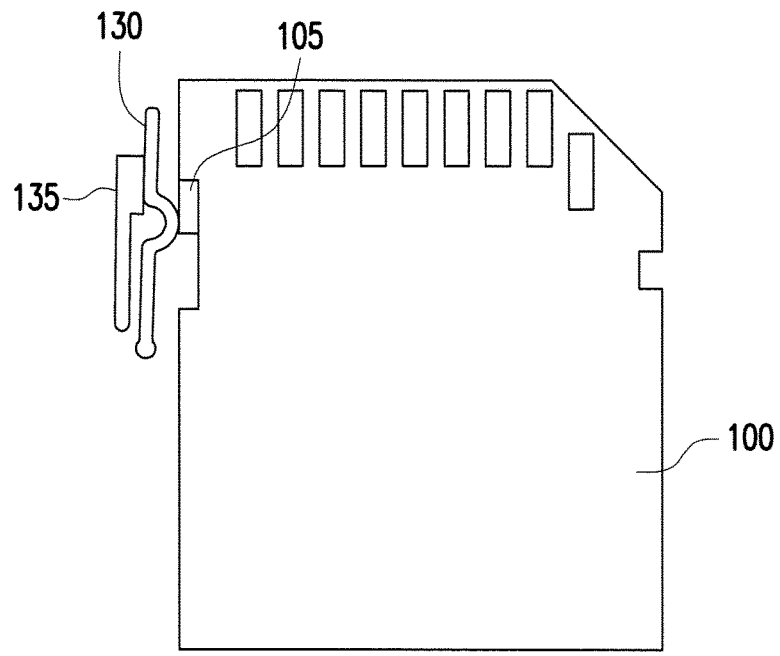
FIG. 1A and FIG. 1B are examples of a secure digital card having a write-protection switch.
Figure 1B:
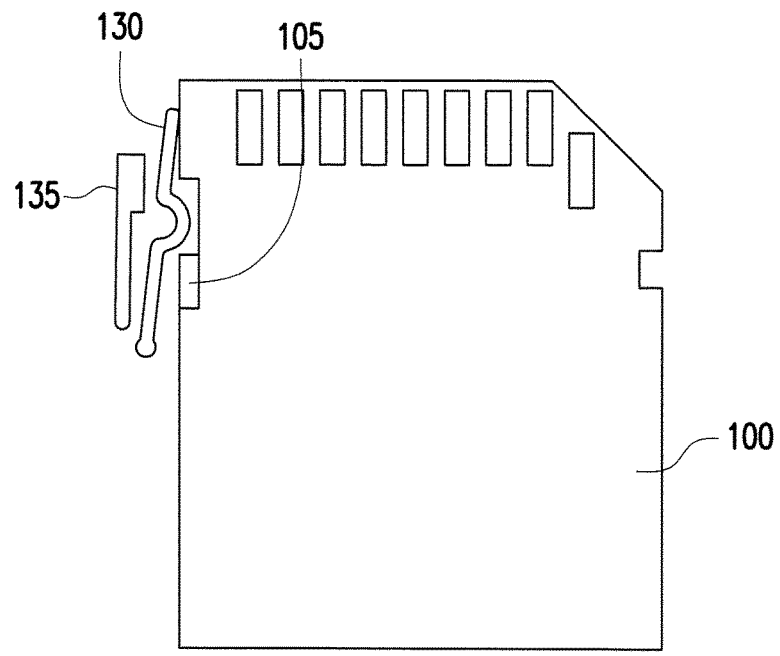
Figure 2:
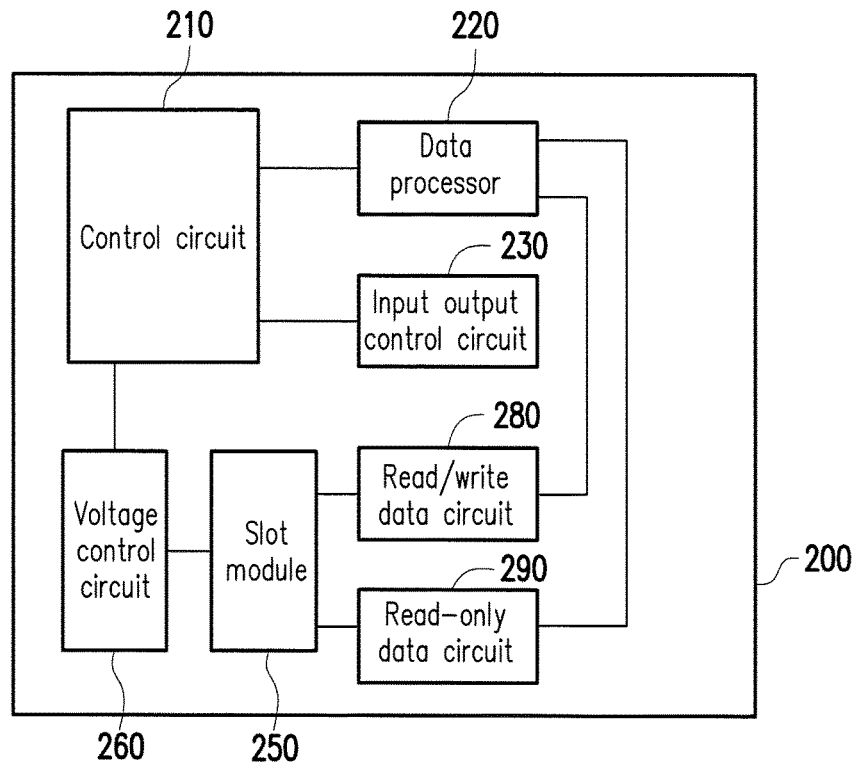
FIG. 2 is a circuit block diagram of an access apparatus of memory card according to an embodiment of the invention.

FIG. 2 is a circuit block diagram of an access apparatus of memory card according to an embodiment of the invention. Referring to FIG. 2, the access apparatus 200 at least includes a control circuit 210, a data processor 220, an input output control circuit 230, a slot module 250, a voltage control circuit 260, a read/write data circuit 280 and a read-only data circuit 290. The access apparatus 200 of the invention is adapted for receiving a memory card of any type such as a multi media card (MMC), a secure digital (SD) card, a compact flash (CF) card, etc., and can also be built in or externally connected to a computer host (for example, a personal computer (PC), a notebook, a tablet PC, etc.) to facilitate a user performing an access operation at the computer host, so as to read a memory card inserted in the access apparatus 200. In some embodiments, one or more of the control circuit 210, the data processor 220, the input output control circuit 230, the slot module 250, the voltage control circuit 260, the read/write data circuit 280 and the read-only data circuit 290 can be combined into one chip or circuit.

The control circuit 210 at least includes a processing unit such as a central processing unit (CPU), or other programmable general-purpose or special-purpose microprocessor, an application specific integrated circuit (ASIC), a system on chip (SoC) or other similar device. The control circuit 210 is used for sending a control instruction to the voltage control circuit 260, and executes the control instruction to control data processing and data input/output of the memory card.

For example, the control circuit 210 can transmit a voltage control instruction including a voltage magnitude instruction, a turning on/off instruction, etc. to the voltage control circuit 260. The control circuit 210 can transmit an access control instruction including a read, write, erase, format instruction, etc. to the data processor 220. The control circuit 210 can also transmit different access control instructions to the data processor 220 according to a read/write state or a read-only state. Moreover, the control circuit 210 can further transmit a control instruction including a receiving instruction, a data output instruction, etc. to the input output control circuit 230.

The data processor 220 performs a data access operation to the memory card through the read/write data circuit 280 or the read-only data circuit 290 and the slot module 250 according to the access control instruction of the control circuit 210. In the present embodiment, the data processor 220 can perform the data access operation to the memory card through any type of interface protocol such as a serial peripheral interface (SPI) mode, an MMC mode, an SD mode, etc.

The input output control circuit 230 can be a controller supporting any type of transmission interface such as a universal asynchronous receiver-transmitter (UART) or a universal serial bus (USB), and is used for communicating with the computer host coupled thereto according the control instruction such as a receiving instruction, a data output instruction, etc. of the control circuit 210.

The slot module 250 includes a slot having a first supply voltage pin and a second supply voltage pin. When the memory card is inserted in the slot, the supply voltage pin of the memory card is selectively and electrically coupled to one of the first supply voltage pin and the second supply voltage pin. In an embodiment, the first supply voltage pin is disposed on one side of the slot, and the second supply voltage pin is disposed on the other side of the slot, and the first supply voltage pin and the second supply voltage pin are spaced apart and directly opposite to each other.

Figure 3:
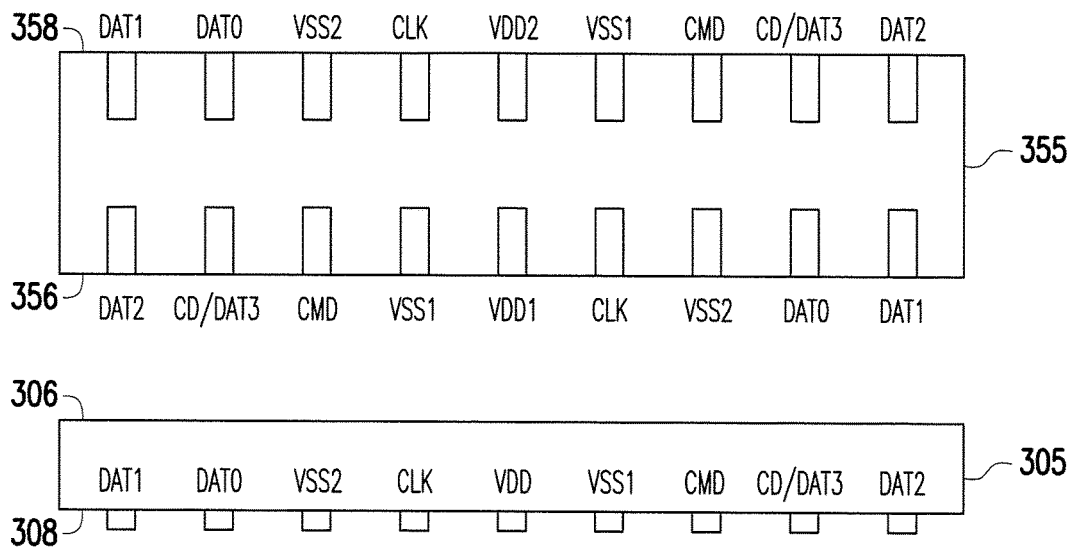
FIG. 3 is a schematic diagram of pin configurations of a slot of an access apparatus and a memory card.

For example, FIG. 3 is a schematic diagram of pin configurations of the slot of the access apparatus and the memory card. Referring to FIG. 3 and a following table (1) of pin definition, a second side 358 (an upper side) of the slot 355 is sequentially configured with a data bit 1 pin DAT1, a data bit 0 pin DAT0, a ground pin VSS2, a clock pin CLK, a second supply voltage pin VDD2, a ground pin VSS1, a command pin CMD, a card detection/data bit 3 pin CD/DAT3 and a data bit 2 pin DAT2, which respectively correspond to the pins on an SD memory card 305 (which is described later). A first side 356 (a lower side) of the slot 355 is sequentially configured with the data bit 2 pin DAT2, the card detection/data bit 3 pin CD/DAT3, the command pin CMD, the ground pin VSS1, the first supply voltage pin VDD1, the clock pin CLK, the ground pin VSS2, the data bit 0 pin DAT0 and the data bit 1 pin DAT1, where an arranging sequence of the pins of the first side 356 is opposite to an arranging sequence of the pins of the second side 358, and the pins on the first side 356 also respectively correspond to the pins of a back side of the SD memory card 305. The first supply voltage pin VDD1 is configured in opposite to the second supply voltage pin VDD2. The memory card 305 has a front side 306 and a back side 308, and the data bit 1 pin DAT1, the data bit 0 pin DAT0, the ground pin VSS2, the clock pin CLK, a supply voltage pin VDD, the ground pin VSS1, the command pin CMD, the card detection/data bit 3 pin CD/DAT3 and the data bit 2 pin DAT2 are sequentially disposed on the back side 308, which has an arranging sequence the same with that of the pins on the first side 358 of the slot 355.

TABLE (1)

| Name | Type | Description |
|---|---|---|
| CD/DAT3 | I (input)/O (output)/PP (push-pull) | Card detection/data bit 3 |
| CMD | PP | command/reply |
| VSS1 | S (power supply) | grounding |
| VDD1/VDD2 | S | First/second supply voltage |
| CLK | I | Clock |
| VSS2 | S | Grounding |
| DAT0 | I/O/PP | Data bit 0 |
| DAT1 | I/O/PP | Data bit 1 |
| DAT2 | I/O/PP | Data bit 2 |

It should be noticed that in the slot 355 of FIG. 3, the pins with a same definition name can be connected in series or parallel to the post read/write data circuit and the read-only data circuit, and the pins can be configured with a metal elastic piece or any type of element capable of electrically coupling to the pins of the memory card, which can be modified according to an actual requirement of the user, and is not limited by the invention.

Figure 4A:
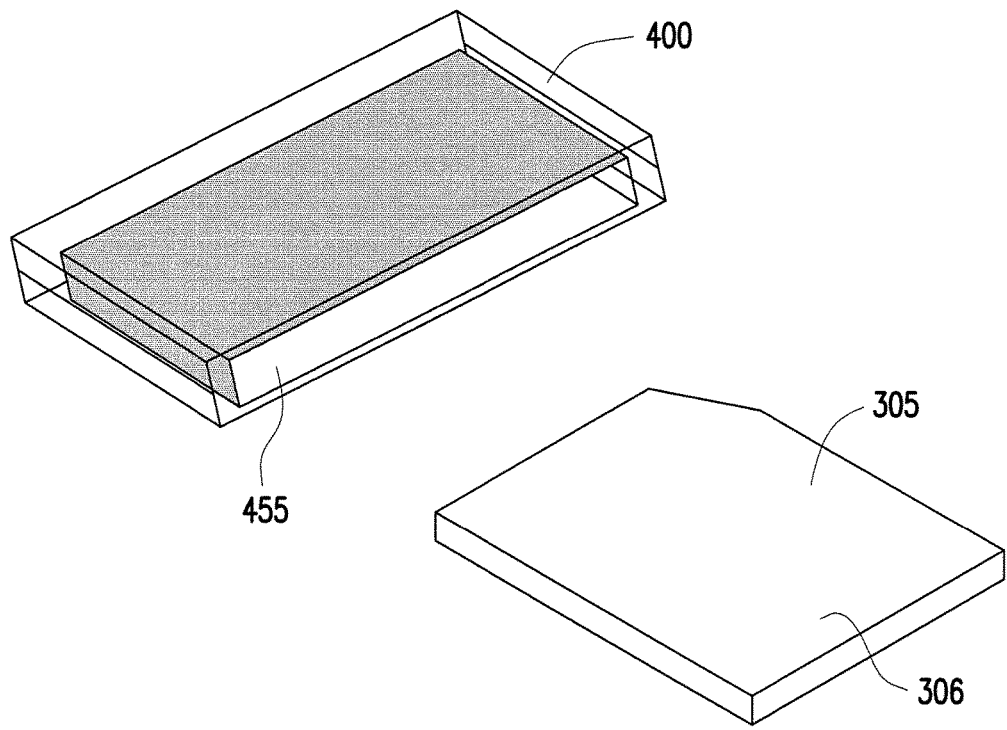
FIG. 4A and FIG. 4B are schematic diagrams of a memory card to be inserted into a slot with a front side and a back side facing upward.
Figure 4B:
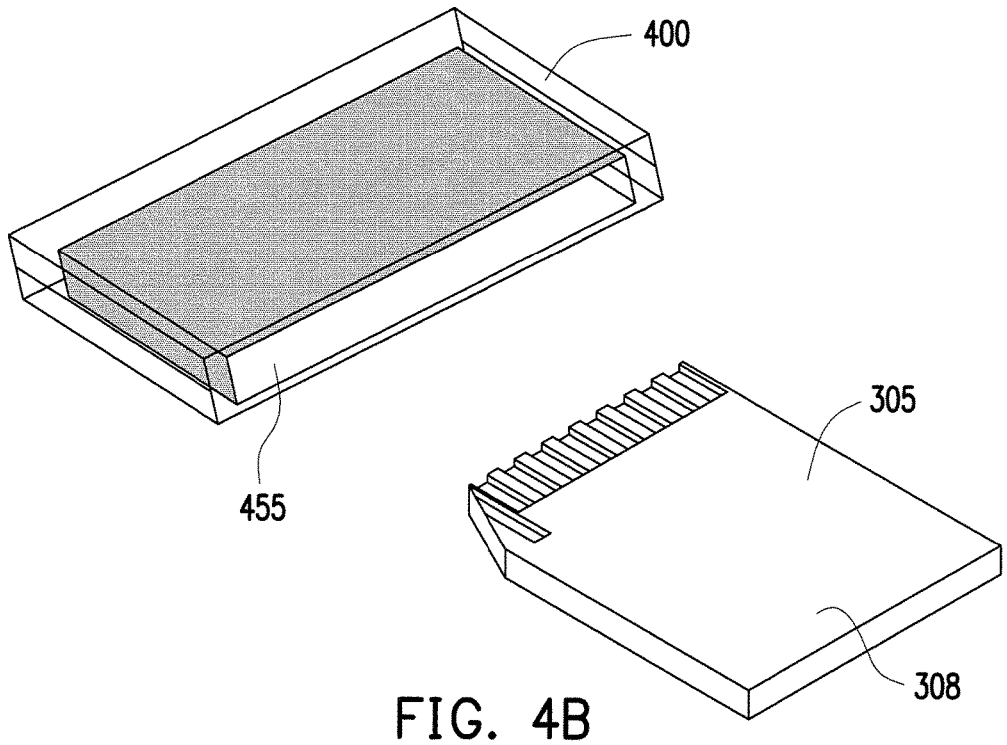

FIG. 4A and FIG. 4B are schematic diagrams of a memory card to be inserted into a slot with the front side and the back side facing upward, respectively. Referring to FIG. 3 and FIG. 4A, it is assumed that an access apparatus 400 has the same or similar circuit configuration with that of the access apparatus 200 of FIG. 2, and a slot 455 has the same pin configuration with that of the slot 355. After the memory card 305 is inserted into the slot 455 of the access apparatus 400 with the front side 306 facing upward (i.e., the side with the exposed pins faces downward), the supply voltage pin VDD of the memory card 305 is electrically connected to the first supply voltage pin VDD1 located at the first side 356 of the slot 455. On the other hand, referring to FIG. 3 and FIG. 4B, after the memory card 305 is inserted into the slot 455 of the access apparatus 400 with the back side 308 facing upward (i.e., the side with the exposed pins faces upward), the supply voltage pin VDD of the memory card 305 is electrically connected to the second supply voltage pin VDD2 located at the second side 358 of the slot 455. Namely, regardless of whether the memory card 305 is inserted into the slot 455 with the front side 306 or the back side 308 facing upward, the supply voltage pin VDD of the memory card 305 is selectively and electrically connected to only one of the first supply voltage pin VDD1 and the second supply voltage pin VDD2.

It should be noticed that in the embodiments of FIG. 3, FIG. 4A and FIG. 4B, the SD card is taken as examples for description, and in other exemplary embodiments, the pin configuration on the slot 355 can also be complied with any memory card such as an MMC (for example, 7 pins), a micro SD card (for example, 8 pins), a mini SD card (for example, 11 pins), etc., though the invention is not limited thereto, and as long as the arranging sequence of the pins at one side of the access apparatus is opposite to the arranging sequence of the pins at the other side, it is considered to be within the scope of the invention.

The voltage control circuit 260 is used for providing a first supply voltage and a second supply voltage to the corresponding pins in the slot of the slot module 250. In an embodiment, the voltage control circuit 260 provides the first supply voltage to the first supply voltage pin VDD1, and provides the second supply voltage to the second supply voltage pin VDD2. The first supply voltage is not equal to the second supply voltage. For example, the first supply voltage is greater than the second supply voltage, the voltage control circuit 260 provides a voltage of 5V to the first supply voltage pin VDD1 of FIG. 3, and provides a voltage of 1V to the second supply voltage pin VDD2 of FIG. 3. Alternatively, the first supply voltage is smaller than the second supply voltage, the voltage control circuit 260 provides a voltage of 1.8V to the first supply voltage pin VDD1 of FIG. 3, and provides a voltage of 4.8V to the second supply voltage pin VDD2 of FIG. 3.

Moreover, in an embodiment, the voltage control circuit 260 includes a boost circuit and a buck circuit. The boost circuit is used for providing the first supply voltage, and the buck circuit is used for providing the second supply voltage.

For example, FIG. 5 is a circuit schematic diagram of the slot module and the voltage control circuit. Referring to FIG. 5, the voltage control circuit 260 includes a boost circuit 261 and a buck circuit 263. The boost circuit 261 provides the first supply voltage to the first supply voltage pin VDD1 of the slot module 250, and the buck circuit 263 provides the second supply voltage to the second supply voltage pin VDD2 of the slot module 250. It should be noticed that the type (for example, digital chips, various kinds of circuits, etc.) of the boost circuit 261 and the buck circuit 263 and a specification of each element (for example, a resistor, a capacitor, etc.) therein are not limited by the invention, which can be changed according to an actual design requirement of the user. Moreover, in another exemplary embodiment, the boost circuit 261 can provide the first supply voltage to the second supply voltage pin VDD2 of the slot module 250, and the buck circuit 263 can provide the second supply voltage to the first supply voltage pin VDD1 of the slot module 250.

The read/write data circuit 280 and the read-only data circuit 290 operate according to conduction status of the first supply voltage pin (for example, the supply voltage pin VDD1 of FIG. 3) and the second supply voltage pin (for example, the supply voltage pin VDD2 of FIG. 3), and detailed steps thereof are described in a following embodiment.

In order to help understanding the operation steps of the access apparatus 200 of memory card of FIG. 2, another embodiment is provided below for description. FIG. 6 is a flowchart illustrating a control method for an access apparatus of memory card according to an embodiment of the invention. Referring to FIG. 6, the control method of the present embodiment is adapted to the access apparatus 200 of FIG. 2. In following descriptions, the control method of the present embodiment is described below with reference of various components of the access device 200. The flow of the control method of the present embodiment can be adjusted according to an actual implementation, which is not limited by the invention.

In step S601, the access apparatus 200 provides a slot module, where the slot module includes a slot (for example, the slot 355 of FIG. 3) having a first supply voltage pin and a second supply voltage pin spaced apart and opposite to each other for receiving insertion of the memory card (for example, the memory card 305 of FIG. 3). Configuration of the first supply voltage pin and the second supply voltage pin may refer to the aforementioned detailed descriptions of the slot module 250 of FIG. 2 and the slot 355 of FIG. 3, which is not repeated. The memory card only has one supply voltage pin on one of the front side and the back side thereof.

In step S603, according to the conduction status of the first supply voltage pin and the second supply voltage pin with the supply voltage pin of the memory card caused by a facing direction of the memory card inserted in the slot, a write operation performed to the memory card is selectively forbidden or permitted. In an embodiment, the voltage control circuit 260 provides the first supply voltage to the first supply voltage pin, and provides the second supply voltage to the second supply voltage pin. The control circuit 210 of the access apparatus 200 determines whether the first supply voltage or the second supply voltage is received, so as to determine the conduction status of the first supply voltage pin and the second supply voltage pin.

To be specific, it is assumed that the user inserts the memory card into the slot of the slot module with one side thereof facing upward (for example, the front side 306 or the back side 308 of the memory card 305 of FIG. 3 faces upward), when one of the first supply voltage pin and the second voltage pin is electrically connected to the power voltage pin on the memory card, one of the boost circuit and the buck circuit forms a loop in response to the electrical connection of the power supply pin, such that one of the first supply voltage pin and the second supply voltage pin is conducted. On the other hand, when the first supply voltage pin and/or the second supply voltage pin are/is not electrically connected to the supply voltage pin on the memory card, the boost circuit and/or the buck circuit forms an open circuit, such that the first supply voltage pin and/or the second supply voltage pin are/is not conducted.

Taking the embodiments of FIG. 3, FIG. 4A and FIG. 4B as an example, referring to FIG. 3 and FIG. 4A, when the memory card 305 is inserted into the slot 455 with the front side 306 thereof facing upward, the supply voltage pin VDD of the memory card 305 is electrically connected to the first supply voltage pin VDD1 of FIG. 3, such that the control circuit 210 of the access apparatus 200 determines that the first supply voltage pin VDD1 is conducted and the second supply voltage pin VDD2 is not conducted. Referring to FIG. 3 and FIG. 4B, when the memory card 305 is inserted into the slot 455 with the back side 308 thereof facing upward, the supply voltage pin VDD of the memory card 305 is electrically connected to the second supply voltage pin VDD2 of FIG. 3, such that the control circuit 210 of the access apparatus 200 determines that the second supply voltage pin VDD2 is conducted and the first supply voltage pin VDD1 is not conducted.

It should be noticed that in some embodiments, the first supply voltage pin and the second supply voltage pin in the slot can be directly coupled to the control circuit 210. Now, the control circuit 210 can directly determine whether the first supply voltage or the second supply voltage is received, and the method for determining the conduction status is not limited by the invention.

Moreover, in some embodiments, if the control circuit 210 of the access apparatus 200 determines that the first supply voltage is received, the control circuit 210 does not forbid performing the write operation to the memory card. If the control circuit 210 of the access apparatus 200 determines that the second supply voltage is received, the control circuit 210 forbids performing the write operation to the memory card.

To be specific, since the supply voltage pin of the memory card is only electrically connected to one of the first supply voltage pin and the second supply voltage pin in the slot, after the memory card is inserted into the slot, the control circuit 210 of the access apparatus 200 can determine whether the first supply voltage or the second supply voltage is received according to a voltage value or a voltage information transmitted by the data processor 220. If the control circuit 210 of the access apparatus 200 determines that the first supply voltage is received (i.e. the first supply voltage pin is conducted), the read/write data circuit 280 starts to operate, and now the control circuit 210 of the access apparatus 200 can perform the write operation to the memory card. If the control circuit 210 of the access apparatus 200 determines that the second supply voltage is received (i.e., the second supply voltage pin is conducted), the read-only data circuit 290 starts to operate, and now the control circuit 210 of the access apparatus 200 cannot perform the write operation to the memory card (i.e., write protection). In other words, the control circuit 210 of the access apparatus 200 perform the write-protection operation to the memory card.

In an embodiment, when the control circuit 210 of the access apparatus 200 determines that the second supply voltage pin is conducted (or the control circuit 210 receives the second supply voltage), the input output control circuit 230 further transmits a write protection-related instruction or information to the coupled computer host, and then a write protection state notification is displayed on a display of the computer host (for example, "SD card is in the write protection state") to notify the user. It should be noticed that in other exemplary embodiments, the access apparatus 200 can notify the user that the write protection is activated by any means, for example, the access apparatus 200 is further configured with a lighting module to flash light, the computer host sends a notification sound, etc., which is not limited by the invention.

Accordingly, the control method of the present embodiment can activate the write protection mechanism according to a facing direction of the memory card inserted in the slot (for example, the memory card is inserted into the slot with the front side or the back side facing upward). In order to help understanding the steps of the aforementioned embodiment, an example is provided below to describe the operation flow of the embodiment of the invention.

Figure 7:
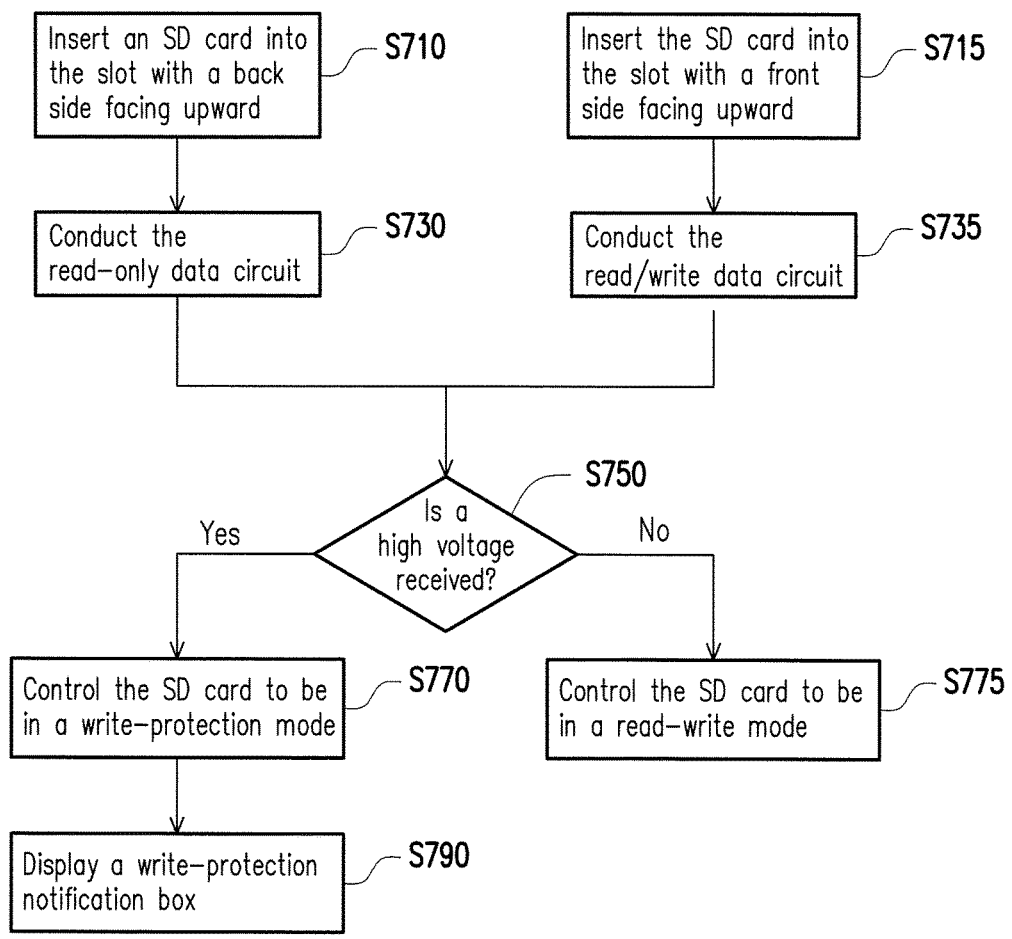
FIG. 7 is a flowchart of access control of a memory card.

FIG. 7 is a flowchart of access control of a memory card. Referring to FIG. 7, when the SD card is inserted into the slot (for example, the slot 355 of FIG. 3) with the back side facing upward (step S710), the read-only data circuit 290 operates (step S730). The access apparatus 200 determines whether a high voltage of 5V is received (step S750). It is assumed that the high voltage of 5V is supplied to the read/write data circuit 280, the access apparatus 200 controls the SD card to be in a write protection mode (step S770), and a notification box of write protection is displayed on a connected notebook (step S790). On the other hand, when the SD card is inserted into the slot with the front side facing upward (step S715), the read/write data circuit 280 operates (step S735). The access apparatus 200 determines whether the high voltage of 5V is received (step S750). If the access apparatus 200 determines that a low voltage of 5V is received, the access apparatus 200 controls the SD card to be in a read/write mode (step S775).

In summary, in the invention, by configuring a set of memory card pins to another side of the conventional memory card slot facing the side already configured with pins, the memory card can be inserted into the slot with the front side or back side facing upward. Then, the access apparatus of the invention determines whether the supply voltage of one of the upper pin and lower pin electrically connected to the memory card is conducted, so as to determine whether to forbid performing the write operation to the memory card. Accordingly, compared to the conventional write protection mechanism having the write-protection switch, the embodiments of the invention have following advantages. First, the write-protection switch of the memory card is omitted, such that a probability of the protection cases of the integrally packaged memory card being splitting is decreased, so as to extend a life time of the memory card. Second, since the memory card does not have the write-protection switch, the situation that determination of the read/write operation cannot be normally implemented due to loose of the write-protection switch is avoided. Third, the user can intuitively insert the memory card into the slot of the access apparatus to implement write-protection according to an actual requirement. Fourth, when the elastic pieces configured on one set of the pins are electrically connected to the memory card, the elastic pieces configured on another set of the pins are squeezed to fix the memory card.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An access apparatus of memory card, adapted for receiving a memory card with a side having a supply voltage pin, the access apparatus comprising:
   a slot module, having a slot to receive insertion of the memory card, wherein the slot comprises a first side and a second side corresponding to each other, the first side and the second side are respectively configured with a first supply voltage pin and a second supply voltage pin, and the first supply voltage pin and the second supply voltage pin are spaced apart and opposite to each other, wherein the access apparatus selectively determines whether to forbid performing a write operation to the memory card according to a conduction status of the first supply voltage pin and the second supply voltage pin with the supply voltage pin caused by a facing direction of the memory card inserted in the slot.

2. The access apparatus of memory card as claimed in claim 1, further comprising:
   a voltage control circuit, providing a first supply voltage to the first supply voltage pin, and providing a second supply voltage to the second supply voltage pin, wherein the first supply voltage is different to the second supply voltage, and the access apparatus determines whether the first supply voltage or the second supply voltage is received, so as to determine the conduction status of the first supply voltage pin and the second supply voltage pin.

3. The access apparatus of memory card as claimed in claim 2, wherein
   when the access apparatus determines that the first supply voltage is received, the access apparatus does not forbid performing the write operation to the memory card; and
   when the access apparatus determines that the second supply voltage is received, the access apparatus forbids performing the write operation to the memory card.

4. The access apparatus of memory card as claimed in claim 2, wherein the voltage control circuit comprises:
   a boost circuit, configured to provide the first supply voltage; and
   a buck circuit, configured to provide the second supply voltage.

5. The access apparatus of memory card as claimed in claim 3, further comprising a control circuit, a read/write data circuit and a read-only data circuit, wherein when the control circuit receives the first supply voltage, the read/write data circuit operates, and the write operation is able to be performed to the memory card, and when the control circuit receives the second supply voltage, the read-only data circuit operates, and the write operation is unable to be performed to the memory card.

6. The access apparatus of memory card as claimed in claim 5, further comprising an input output control circuit, wherein when the control circuit receives the second supply voltage, the input output control circuit further transmits a write protection related instruction to a display to display a write protection state notification.

7. The access apparatus of memory card as claimed in claim 1, wherein the first side of the slot comprises a plurality of pins containing the first supply voltage pin, the second side comprises a plurality of pins containing the second supply voltage pin, and an arranging sequence of the pins of the first side is opposite to an arranging sequence of the pins of the second side.

8. The access apparatus of memory card as claimed in claim 1, wherein the memory card has a front side and a back side opposite to each other, and the supply voltage pin is configured on the back side.

9. A control method for an access apparatus of memory card, wherein the access apparatus is adapted for receiving a memory card with a side having a supply voltage pin, the control method comprising:

providing a slot module, wherein the slot module having a slot to receive insertion of the memory card, the slot comprises a first side and a second side corresponding to each other, the first side and the second side are respectively configured with a first supply voltage pin and a second supply voltage pin, and the first supply voltage pin and the second supply voltage pin are spaced apart and opposite to each other;

conducting the supply voltage pin with the first supply voltage pin of the slot when the memory card is inserted into the slot module with a first facing direction, such that a write operation is able to be performed to the memory card; and conducting the supply voltage pin with the second supply voltage pin of the slot when the memory card is inserted into the slot module with a second facing direction, such that the write operation is forbidden to be performed to the memory card.

10. The control method as claimed in claim 9, further comprising:

providing a first supply voltage to the first supply voltage pin, and providing a second supply voltage to the second supply voltage pin; and determining whether the first supply voltage or the second supply voltage is received by the access apparatus, so as to determine that the first supply voltage pin or the second supply voltage pin is conducted to the supply voltage pin.

11. The control method as claimed in claim 10, further comprising:

not to forbid performing the write operation to the memory card when it is determined that the first supply voltage is received; and forbidding performing the write operation to the memory card when it is determined that the second supply voltage is received.

12. The control method as claimed in claim 10, wherein the step of providing the first supply voltage to the first supply voltage pin, and providing the second supply voltage to the second supply voltage pin comprises:

providing the first supply voltage through a boost circuit; and providing the second supply voltage through a buck circuit.

13. The control method as claimed in claim 9, wherein the step of forbidding performing the write operation comprises:

transmitting a write protection related instruction to a display by an input output control circuit, so as to display a write protection state notification.

14. The control method as claimed in claim 9, wherein the memory card has a front side and a back side opposite to each other, and the supply voltage pin is configured on the back side, wherein the first facing direction is that front side faces upward, and the second facing direction is that the back side faces upward.

* * * * *